United States Patent [19]
Mizoguchi et al.

[11] Patent Number: 5,377,894
[45] Date of Patent: Jan. 3, 1995

[54] WIRE BONDER SYSTEM

[75] Inventors: Kiyoshi Mizoguchi; Ryoetsu Sato; Morikazu Gotoh, all of Tokyo, Japan

[73] Assignee: Kan Electronics Co., Ltd., Tokyo, Japan

[21] Appl. No.: 113,649

[22] Filed: Aug. 31, 1993

[30] Foreign Application Priority Data

Sep. 29, 1992 [JP] Japan ................................. 4-258758

[51] Int. Cl.6 ............................................. H01L 21/60
[52] U.S. Cl. .................................... 228/1.1; 228/4.5; 228/56.5
[58] Field of Search ..................... 228/1.1, 4.5, 56.5, 228/103, 180.5, 110.1

[56] References Cited

U.S. PATENT DOCUMENTS

| | | | |
|---|---|---|---|
| 4,208,001 | 1/1980 | Martner | 228/1.1 |
| 4,781,319 | 11/1988 | Deubzer et al. | 228/1.1 |
| 4,808,948 | 2/1989 | Patel et al. | 228/4.5 |
| 5,180,093 | 1/1993 | Stansbury et al. | 228/1.1 |
| 5,244,140 | 9/1993 | Ramsey et al. | 228/1.2 |

*Primary Examiner*—Samuel M. Heinrich
*Attorney, Agent, or Firm*—Longacre & White

[57] ABSTRACT

A wire bonder system comprising mounting a tool for ultrasonic bonding onto a transducer and the tool is protruded from the transducer with its bonding side to supply the high frequency electric power to the transducer. The protruded length of the tool is adjusted so as to avoid the length protruded from the transducer to minimize the high frequency electric power.

8 Claims, 12 Drawing Sheets

FIG.7(a)
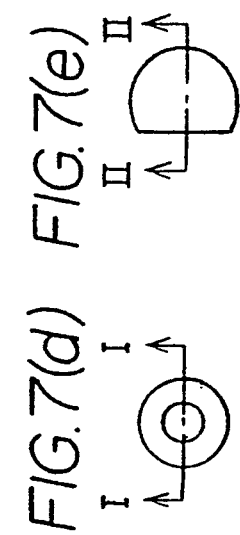
FIG.7(b)
FIG.7(c)
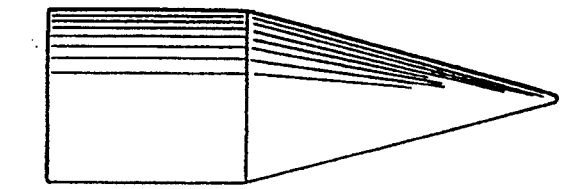
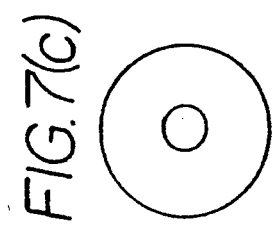
FIG.7(d)
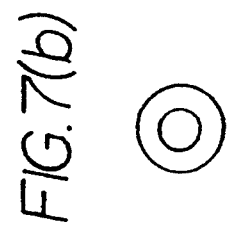
FIG.7(e)
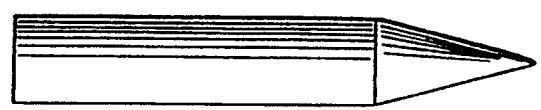

(a)

(b)

WIRE BONDER SYSTEM

FIELD OF THE INVENTION

The present invention relates to a wire bonder system for bonding a very fine wire onto a surface to be bonded by means of an ultrasonic bonding method applying ultrasonic vibration as energy, particularly a wire bonder system to supply high frequency electric power to a transducer with stability to effectively convert the high frequency electric power to the ultrasonic bonding energy.

BACKGROUND OF THE INVENTION

Description of Prior Art

It is considered to be important to effectively convert the high frequency electric power to mechanical vibration. For this purpose, there have been proposed various wire bonder systems in which ultrasonic vibration is impressed to a very fine wire through a tool attached to the wire bonder system and when said fine wire is accurately ultrasonic bonded onto the surface to be bonded, high frequency electric power is supplied from electric power unit to a transducer with stability.

FIG. 5 indicates an example of ultrasonic bonding of a general wire bonder system. The wire bonder system comprises an electric power unit 1, a transducer 2 to enlarge an effective component of mechanical vibration generated in the electric power unit 1 and a tool 4 for ultrasonic bonding of the conductive wire 3 to a bonding surface using said enlarged effective component from the enlarged side of the transducer. The wire bonder system is housed in a wire bonding machine (not shown) and is applied for wiring semiconductor parts 6 on a table 5.

Said electric power unit 1 comprises an oscillator 1a to generate high frequency signal and an amplifier 1b to stabilize the electric power of the signal to a predetermined voltage value or electric current value, tuning the frequency of the signal automatically to a value adaptable to the vibration property of the transducer 2. High frequency electric power is always distributed to the transducer 2 with optimum frequency, voltage value or electric current value through the wiring.

The transducer 2 is provided with a piezoelectric transducer 8 to convert the supplied high frequency electric power to mechanical vibration at its one end. The transducer 2 is also provided at its opposite end with a horn 10 to enlarge amplitude of the extracted effective component of vibration through a cone 9 to extract an effective component of converted vibration. The transducer 2 is supported at a fulcrum 9b of the wire bonding machine not indicating total weight of itself and the enlarged side of the transducer is moved forward and backward (arrow 12) by rotating said enlarged side upward and downward and leftward and rightward (arrow 11) by predetermined distance.

The horn 10 is provided with a clamp portion 10a to fit the tool 4 at the enlarged side of amplitude. The tool 4 is inserted with its installing side into the clamp portion 10a and fixedly tightened to it by means of screw 13.

The tool 4 uses either a capillary 4 which is a cylindrical form having a fine tubular hole 4a in the axial direction or a wedge which is a semicylindrical form having a fine tubular hole slanted by predetermined angle to the bonding side in the axial direction. The tool 4 is constructed with its bonding side sharpened and to fix the opposite side to the clamp portion 10a of the horn.

The piezoelectric transducer 8 applies either an electrostricted piezoelectric transducer which is composed of piling up a plural number of thin plates using a piezoelectric effect member and a plural number of electrodes alternatively, or a magnetostricted piezoelectric transducer which is composed of winding up coils around a plural number of cores using a magnetostricted effect member. The electric power unit 1 supplies an electric current stabilized to the predetermined value to electrostricted piezoelectric transducer and supplies an electric current stabilized to the predetermined value to the magnetostricted piezoelectric transducer.

The table 5 houses a heater to assist heating the semiconductor parts 6 placed on the table.

The semiconductor part 6 is composed of a substrate 6 of printed wire with multi-conduction pattern and an integral circuit chip 6c provided with a plural number of electrode 6b made of aluminum, gold vapor deposition and hybrid circuit die bonded on the surface of the substrate 6. Very fine conductive wire 3 is used to wire between said conduction pattern and aluminum electrode 6b.

Next, general treatment of wire bonder system and behavior thereof are explained. The wire 3 used for wiring is made of very fine gold wire, aluminum wire and in rare case copper wire. When gold wire or copper wire is used the capillary is attached to the transducer as the tool and when other wiring materials are applied wedge is attached to the transducer as the tool. When gold is used for wire 3 the semiconductor part 6 is heated beforehand by the heater (not shown). The following is an explanation of the case that gold is used as capillary.

The wire bonding machine (not shown in figure) is switched on. High frequency electric power is generated in the electric power unit 1. The semiconductor part 6 on the table is heated to the predetermined temperature. On the other hand, the wire is pulled out from a wire supporting equipment (not shown) and it is inserted into the tubular hole 4a of the capillary 4 from the fixed side and protruded from the bonding side. The tip of the wire 3 is made round to be adaptable to ball bonding by means of melting torch. After the preparation step of the foregoing is over practical wiring operation is started.

The bonding side of the capillary 4 is moved to the aluminum electrode 6b provided on the integral circuit chip 6c by controlling the position of wire bonding machine. The gold wire 3 protruded from the bonding side of the capillary is contacted to the surface of the electrode 6b. The gold wire 3 is then pressed to the electrode 6b by adding a predetermined pressure (arrow) 14 in the axial direction of the capillary 4.

Next, generated electric power of high frequency is supplied from the electric power unit 1 to the transducer 2. The supplied electric power is converted to a mechanical vibration of the same high frequency in the axial direction of the transducer 2. The effective component of said converted vibration is amplified and transmitted to the capillary 4.

All components comprising the transducer 2 have proper resonance frequency adaptable to known physical properties, respectively. The axial length of piezoelectric transducer 8, cone 9 and horn 10 are set up to the predetermined length and these parts resonate to the predetermined freqency.

FIG. 6 shows transmission of mechanical vibration of the general wire bonder system. The same reference numerals are used for the same parts disclosed in FIG. 5. Reference numeral 15 indicates a curve of amplitude when the transducer 2 including each component is working in normal condition. Reference numeral 16 indicates the axis of abscissas and the value of amplitude on this axis means theoretical zero.

Reference numeral 17 indicates the amplitude of the connecting portion of the piezoelectric transducer 8 and cone 9. Reference numeral 18 indicates the amplitude of the connecting portion of the cone 9 and horn 10. Reference numeral 19 indicates the amplitude of the connecting portion of horn 10 and capillary 4. Amplitude of resonance at each point being maximum, mechanical vibration is transmitted most effectively. On the other hand, reference numeral 20 indicates amplitude at the piled surface of the transducer member to be used for piezoelectric transducer. Reference numeral 21 indicates amplitude at the supporting point 9b of the transducer 2. At these points amplitude adversely becomes zero, namely, displacement of resonance is zero, thus converted mechanical vibration is prevented from being adversely converted to electrical vibration or being leaked outside from the supporting point 9b.

Accordingly, the transducer 2 provided with the capillary 4 most effectively convert the electric power supplied thereto from the electric power unit 1 and can transmit the vibration to the capillary 4 with the least loss. In other words, impedance of electric power from the electric power unit 1 becomes minimum.

There have been disclosed problems as described hereinunder when the capillary 4 is fitted to an enlarged portion of the general wire bonder system and the semiconductor part 6 is wired with the conductive wire 3.

FIG. 7 shows the kind of capillaries. Total length and diameter are defined as international standard as follows:

S type: total length 0.250 in/6.35 mm
L type: total length 0.375 in/9.525 mm
XL type: total length 0.437 in/11.1 mm
XXL type: total length 0.470 in/12.0 mm
16 mm type: total length 0.630 in/16.0 mm Among them, diameter of 1/16 in. is principal. Very rarely there is ⅛ in.

Various kinds of configuration of the tip of the capillary are used.

FIG. 7(a) indicates a tip of taper of 30°. FIG. 7(b) indicates a tip of taper of 20°. FIG. 7(c) indicates a tip having a diameter twice as much as (a) . FIG. 7(d) indicates a tip of taper of 30° with a bottle neck thereon.

FIG. 8 shows cross-sections of capillary and wedge. FIG. 8(a) is a cross-section taken from I—I line of FIG. 7(d), namely, bottle neck type. The tubular hole 4a of the capillary 4 has an inside cone tapering from body to tip of bonding side, said inside cone having an angle of 10° as principal, and rarely 15°, 20° and 24°.

FIG. 9 is a drawing to explain interference between the bonding side of the capillary and the package wall of the semiconducter part. In practical case, the semiconducter part has a package 6d to compose outside contour. A lead 6c passing through package 6d from an outside contour is provided. The wire 3 to be wired on the surface of the lead 6c is bonded by means of ultrasonic bonding. The capillaries of FIG. 7 are placed against the wall of package 6d facing it with bonding side. It is, therefore, not possible to reach the most optimum bonding position. The triangle portion including arms C1 and C2 which interfere the package 6d should be removed.

FIG. 10 is partially expanded drawing to explain the status at the bonding side of the capillary.

FIG. 10(a) partially eliminates the bonding side of the capillary from one side. It does not interfere with the part of triangle portion of the package 6d of FIG. 9. FIG. 10(b)-(d) present a bottle neck state eliminating the bonding side of capillary from a plural number of direction or all direction. These capillaries do not interfere with various packages but also not interfere with the wire already bonded to high density print wiring and electrodes. Namely, it is possible to reach the optimum bonding position.

The raw material of the capillary was traditionally made of glass when the wire bonding technique for semiconductors was developed but recently the glass has been replaced with tungusten carbide and titan carbide which were taken to process desired properties. These carbide materials are high in strength but their useful life as a capillary is short in comparison with glass. For this reason, nowadays ceramic material is particularly used.

More improved ceramic materials of high density and longer useful life have been developed. From high density ceramic material to multicrystal ruby and sapphire, and then from monocrystal ruby and sapphire to silicon-aluminum-nitride and hybrid ceramic material with a sapphire tip have been developed. These improved materials are used in accordance with requirements of cost and useful life.

In place of the capillary, a wedge of semi-cylindrical tube indicated by FIG. 7(e) is used. FIG. 8(b) is a cross section partially enlarged from II—II line of wedge in FIG. 7(e). The tool 4 using this wedge is provided with a tubular hole 4a inclined from its axial direction. The very fine wire 3 made of aluminum is inserted through the hole 4a and protruded to bonding side. The wire 3 is cut to the predetermined length by the tool. It is possible to continuously wire to a multi-number of electrodes and leads on the semiconductor parts in a particular direction.

There are standard total length and diameter in the international market of the wedge. Total lengths of ¾ in. and 1 in. are common and diameters of 1/16 in., ⅛ in. and 3/32 in. are most widely used. Rarely, diameters of 2 mm and 3 mm are sold. Tungsten carbide is applied as a raw material of these wedges.

On the other hand, tables to place semiconductor to be wired are selected in accordance with kinds of semiconductor or wiring work. A table of rugged surface is sometime used. For these tables of rugged surface a capillary or wedge is protruded from the transducer to avoid such rugged portions.

As described in the foregoing, a capillary or wedge of various dimensions and kinds is applied in accordance with requirements of semiconductor parts and wiring, respectively.

Accordingly, the transducer is required to effectively transmit mechanical vibration by means of respective tools. As described, the value zn of impedance of electric power supplied from the electric power unit is required to be maintained low and stable.

Next, how to fit these tools to the transducer is explained.

FIG. 14 is a flow sheet to explain how to fit these tools to transducers in the prior art. Preparation step 31 to set the condition under which tools are mounted to the transducer is provided. Following the step 31, next step 32 determines whether the step should be avoided or not.

In the preparation step 31, it is required to set up ln length protruded from the transducer to a beginning value L adaptable to the condition of wiring work. Torque value tn of the screw to tighten the tool onto the transducer is set up to a predetermined value T which is adaptable to the tool.

In preparation of avoidance step 32, it is recommended to provide an adjustment step 33 to fix the tool onto transducer and following to this adjustment step 33 a trial step 34 to tentatively function the transducer. Following this trial step 34, a determination step 35 to judge the working result is provided. A compensation step 36 deriving from the determination step 35 and coming back to the adjustment step 33 to change the mounting condition of the tool in accordance with the result obtained in the determination step 35 is provided.

In the adjustment step 33 the tool is protruded by predetermined length of ln beyond the transducer then the screw is fixed by the predetermined torque tn and the tool is tentatively fixed to the transducer.

In the trial step 34 the wire is contacted with its spherical tip to the surface of trial electrode (not shown) in the semiconductor parts. Further, a predetermined pressure is added to the tool in the axial direction and the spherical tip of the wire is contacted to the bonding side of the tool. Electric power of high frequency from the electric power unit is supplied to the transducer and the wire is tentatively bonded. Said predetermined pressure is removed at the determination step.

At the determination step 35, whether the quality of wire bonded at the trial step 34 has reached the standard or not is inspected by skilled operator. Inspection is repeated from the adjustment step 33, the trial step 34 and to the determination step 35 through the compensation step 36 until reaching standard.

When the result obtained in the determination step 35 is determined to be repeated, the compensation step 36 compensates the protruded length ln to ln+1 and said compensated length is applied in the adjustment step 33.

Reference numeral 37 indicates beginning of operation and reference numeral 38 indicates end of operation.

However, in a practical wiring process of semiconductor parts the impedance of supplied electric power sometimes become very unstable and it causes inaccurate bonding result due to the change of the applied tool to different ones. It also happens that the impedance becomes large and wiring work discontinues.

FIG. 11 shows the relation between the value of impedance and the location to mount the capillary. Vertical axis indicates the value zn of the impedance of supplied electric power from the electric power unit in the unit of ohm and horizontal axis indicates the protruded length ln at the bonding side of capillary inserted into the tip of the transducer in the unit of m/m. Reference numeral 23 is a curve indicating the value of zn of impedance of electric power when the protruded length of the capillary is changed. When the length of said protruded length ln is set to approximately 4.5 mm, the slant line portion 27 indicates that the maximum impedance value of 24 is generated.

Reference numeral 25 indicates a curve of polycrystal ruby and when the length of said protruded length is set to approximately 6 mm, the slant line portion 28 indicates the maximum value of 26.

In short, in a consecutive processing of wiring, a capillary made of high density ceramic material is protruded by 6 mm from the transducer. After bonding work has been done in stable condition the capillary is changed to polycrystal ruby with the same length to continue same bonding work and the value zn of impedance of supplied electric power becomes approximately maximum value of 26. It becomes impossible to supply with a fluent ultrasonic energy for bonding and wiring work discontinues.

When the length of the protruded capillary is determined so that the value of impedance zn may occupy maximum values of 24 and 26 the frequency of electric power supplied from the electric power unit cannot maintain the resonance frequency optimum to the characteristics of transducer and it is sometimes transferred to another frequency.

FIG. 12 and FIG. 13 are the drawings which explain the relation between the frequency of the electric power of high frequency supplied to the transducer from the electric power unit and admittance. The horizontal axis indicates that frequency f increases in the right direction and vertical axis indicates that admittance value y increases in the upward direction.

The admittance value y is converse of the impedance value zn of supplied electric power.

As mentioned in the foregoing, the electric power unit automatically adjusts the frequency f of supplied electric power so as to make the impedance value zn to be minimum, said frequency f being tuned to the resonance frequency $F_0$ adaptable to the physical property of wire bonder system, thus said wire bonder system is used for stable bonding.

When the tool is mounted protrudently from the transducer with the length ln so that the impedance value zn of the supplied electric power becomes approximately maximum, the frequency F2 for which the impedance value zn becomes maximum (admittance value becomes minimum) in the vicinity of slant line portion 29 including the resonance frequency $F_0$ of wire bonder system is generated. Thus, the resonance frequency $F_0$ relatively disappears. With this regard, frequency $F_1$, $F_3$ to minimize the impedance value zn (admittance value becomes maximum) which is similar to resonance state at both sides are relatively generated in the slant line portion 30 in the vicinity of frequency F2.

On the other hand, the amplifier 1b of the electric power unit 1 is automatically adjusted to the frequency of the supplied electric power to mimimize the impedance value zn (namely, the admittance value y becomes maximum) in the vicinity of resonance frequency $F_0$ as expected. Thus, in place of the resonance frequency $F_0$ already disappeared in FIG. 13 the amplifier 1b is attracted and tuned to either of the frequency $F_1$ or $F_3$ which give a minimum impedance value zn (in other words, admittance value y is maximum).

In short, electric power of frequency which is far separated from the value expected to be adaptable to the vibration property of transducer is supplied. The energy of this electric power is converted to mechanical vibration through the piezoelectric transducer but it is not accurately transmitted in the transducer due to the reason described in the foregoing. This will cause a loss at the supporting point to support transducer, as well as a piled surface of vibration prevention.

As above mentioned, when the tool is changed in accordance with the use of wiring work, the supplied electric power is changed as follows:
(1) Electric power is not effectively transferred to vibration energy.
(2) Frequency becomes unstable.
The wire is inaccurately bonded.

It is, therefore, a subject of the present invention to present a wire bonding system to supply a high frequency electric power to transducer constantly to effectively convert said electric power to ultrasonic bonding energy.

SUMMARY OF THE INVENTION

In order to solve the above mentioned problem the present invention is composed as follows:

(1) In a wire bonder system composed of the electric power unit to generate the electric power of high frequency, the transducer to convert the electric power to mechanical vibration, whose effective component being extracted and enlarged, and the capillary to proceed ultrasonic bonding using the extracted and enlarged vibration, said capillary being mounted at the enlarged side of the transducer, the capillary is fixed to the transducer adjusting the protruded length of the capillary from the transducer so as to avoid the position at which said electric power is minimized.

(2) The wire bonder system is provided with a means to search the length of the capillary to minimize the electric power, said wire bonder system determine the supplied impedance and avoid the searched length of the capillary.

(3) The wire bonder system is provided with a means to search the length of the capillary to minimize the electric power, said wire bonder system avoid the searched length of the capillary by adding a pressure to the tool.

(4) The wire bonder system is provided with a means to avoid the length of the capillary to minimize the electric power so as to avoid it by expanding and reducing the transducer in its axial direction.

(5) The wire bonder system is provided with a means to indicate the length of the capillary to minimize the electric power and avoid said indicated length of the capillary.

As the tool is mounted to the transducer avoiding the length to maximize the impedance zn of supplied electric power (the value of admittance becomes minimum) the electric power of high frequency is effectively converted to mechanical vibration.

BRIEF DESCRIPTION OF THE DRAWINGS

FIG. 7a–7e are enlarged drawings explaining the kinds of capillary and wedge.

DETAILED DESCRIPTION OF THE PREFERRED EMBODIMENTS

Figure 1:
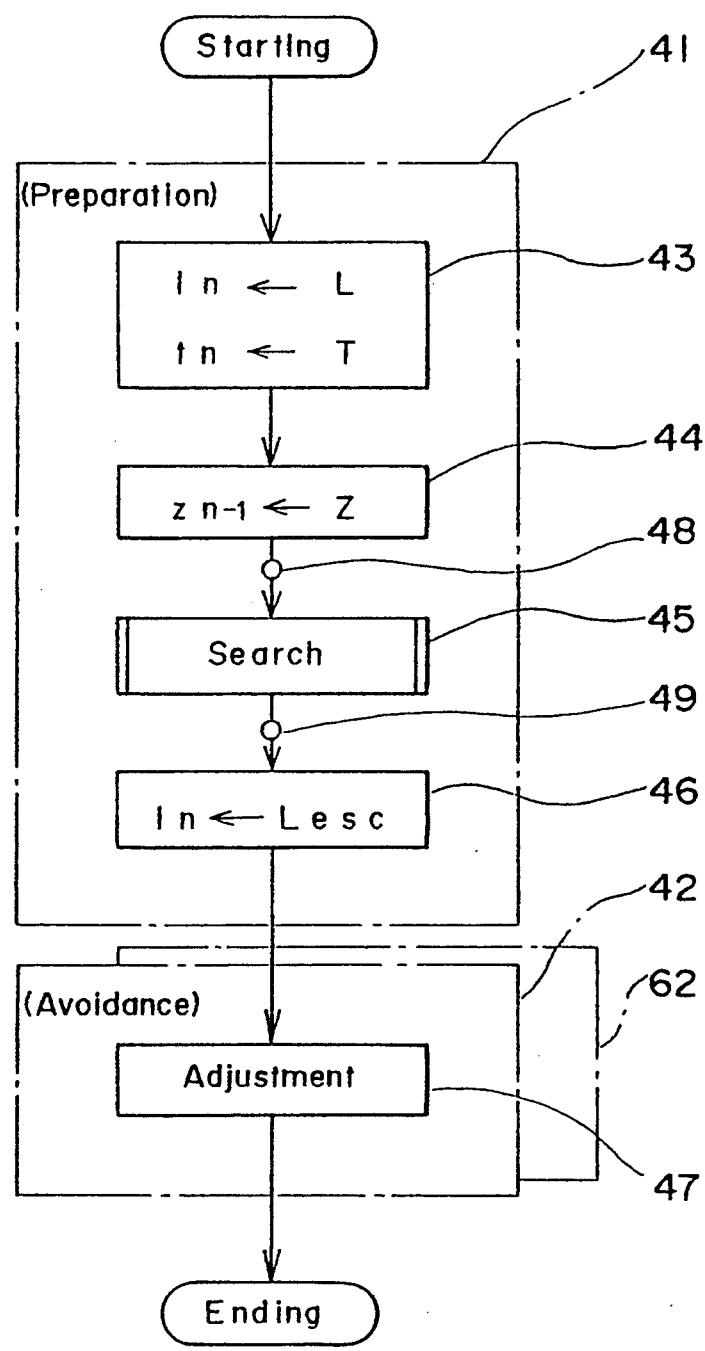
FIG. 1 is a flow sheet indicating embodiments of the method to mount the selected tool to transducer as written in the first and the fourth embodiments.

Now the present invention is explained referring to the drawings. As reference numerals in the drawings are the same number as the used number to explain the prior arts, explanation of the same is omitted.

FIG. 1 is the flow sheet to explain the first embodiment of the present invention, wherein the tool (capillary and wedge) is mounted to the transducer.

Figure 14:
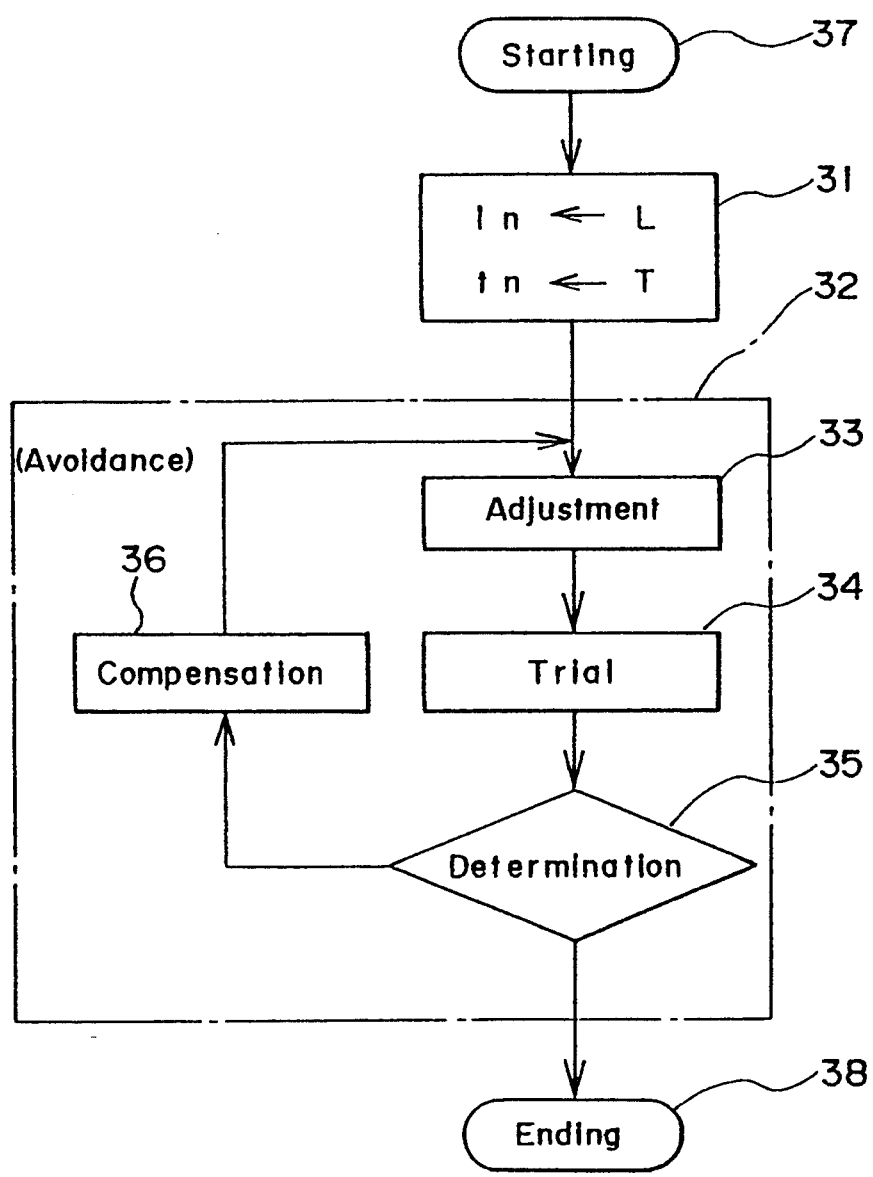
FIG. 14 is a flow sheet explaining the method to mount the tool in prior arts.

The principal part of the embodiment is to provide a preparation step 41 to set up a condition to be avoided when a tool is mounted to a transducer. Following the step 41, an avoidance step 42 is provided to avoid the condition and fix the tool to the transducer. The preparation step 31 of the prior art indicated in FIG. 14 is read as the preparation step 41 of the present invention and the avoidance step 32 of the prior art is read as the avoidance step 42 of the present invention.

As explained in the foregoing, the condition to be avoided is decided in accordance with kind and quality of raw material. Once the condition is set up, the condition afterwards is fixed. Accordingly, the preparation step 41 is eliminated out, of the wiring work afterwards.

The preparation step 41 is set up a short beginning value L to tentatively set the length ln of the tool protruded from the transducer. The tentative fixing step 43 to set the torque tn to tighten the screw to fix the tool to transducer to the predetermined value T is provided. Following to this tentative fixing step 43, the tentative determination step 44 to set the impedance value zn to the predetermined short beginning value Z is provided.

Following to the tentative step 44, the preparation step 41 further provide the search step 45 to look for the condition to mount the tool when the supplied electric power to the transducer is minimized. Following to this search step 45 the determination step 46 to set the length ln protruded from the transducer to Lesc to avoid when the tool is mounted.

The avoidance step 42 avoids the length Lesc set up in the determination step 46 as explained in the preparation step 41. The tool is protruded from the transducer by the avoided length, using the torque T set up in the tentative determination step 43 as explained, and the adjustment step 47 to fix the tool to transducer by tightening the fixing screw is provided. It is recommended to replace the conventional adjustment step 33 shown in FIG. 14 to the adjustment step 47 of the present invention and the conventional steps of trial 34, determination 35 and compensation 36 are removed.

Reference numerals 48 and 49 indicate connection members.

Figure 2:
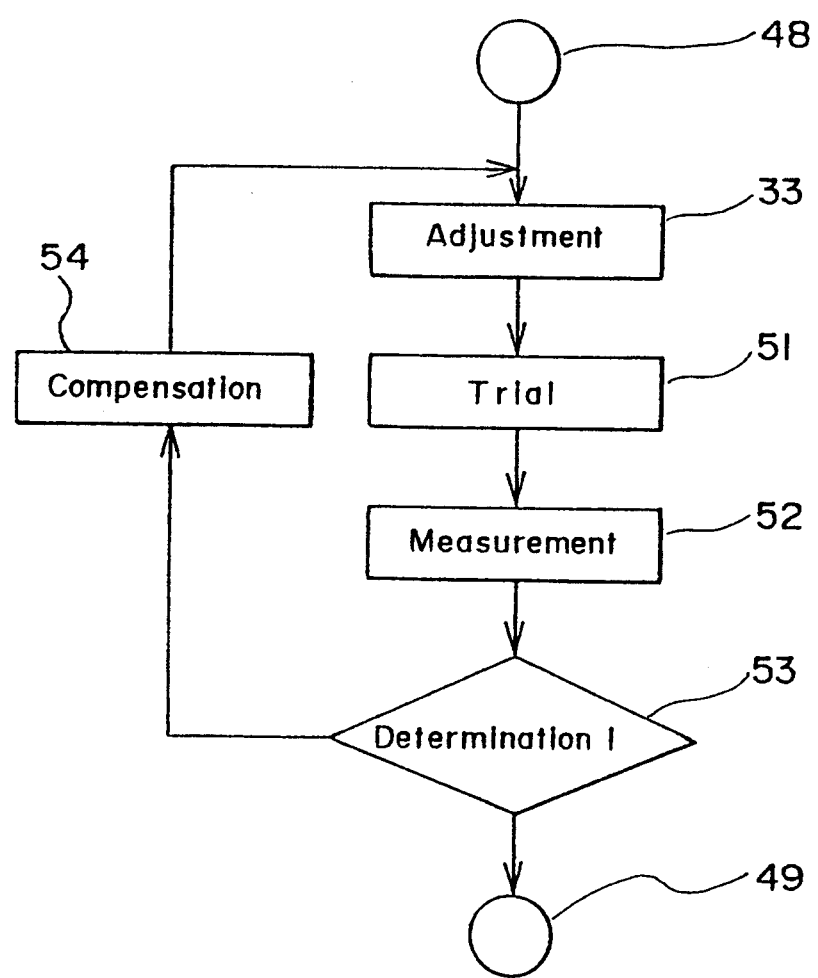
FIG. 2 is a partial flow sheet explaining the second embodiment to perform the present invention.

FIG. 2 is a partial flow sheet to explain the second embodiment of the present invention.

The principal part of the second embodiment is to materialize the search step 45 shown in FIG. 1. Except for this search step 45 the second embodiment is the same as the first one.

This materialized search step 45 provides the adjustment step 33 to tentatively mount the tool to transducer and following this adjustment step 33 the trial step 51 to tentatively drive the transducer is provided. Following this trial step 51, the measurement step 52 to measure the driving state is provided. Further, following to this measurement step 52 the first determination step 53 to determine said measured result is provided. Deriving from the first determination step 53 and coming back to join the adjustment step 33, the compensation step 54 changes the condition to search according to the predetermined result.

The trial step 51 is provided to supply the high frequency electric power from the electric power unit to the transducer.

The measurement step 52 calculates the impedance value zn to supply the electric power by dividing the voltage by the electric current measured.

Figure 11:
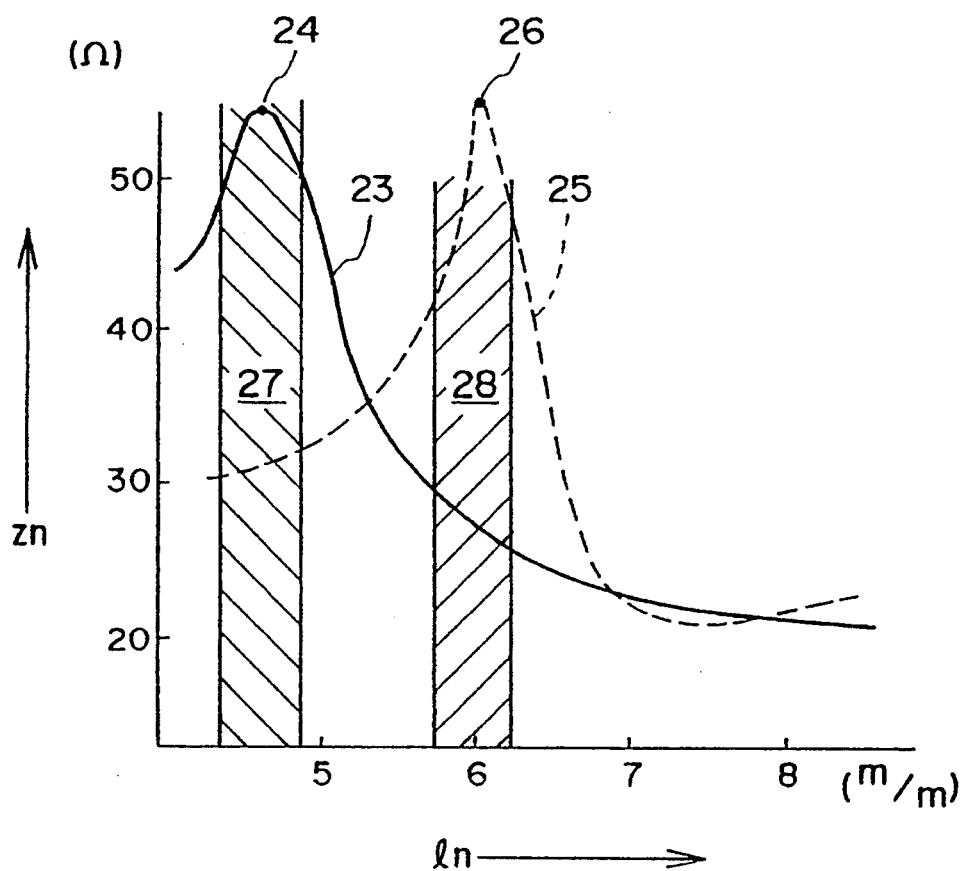
FIG. 11 is a diagram explaining the relation between the impedance of the supplied electric power and mounting location of the capillary.
Figure 12:
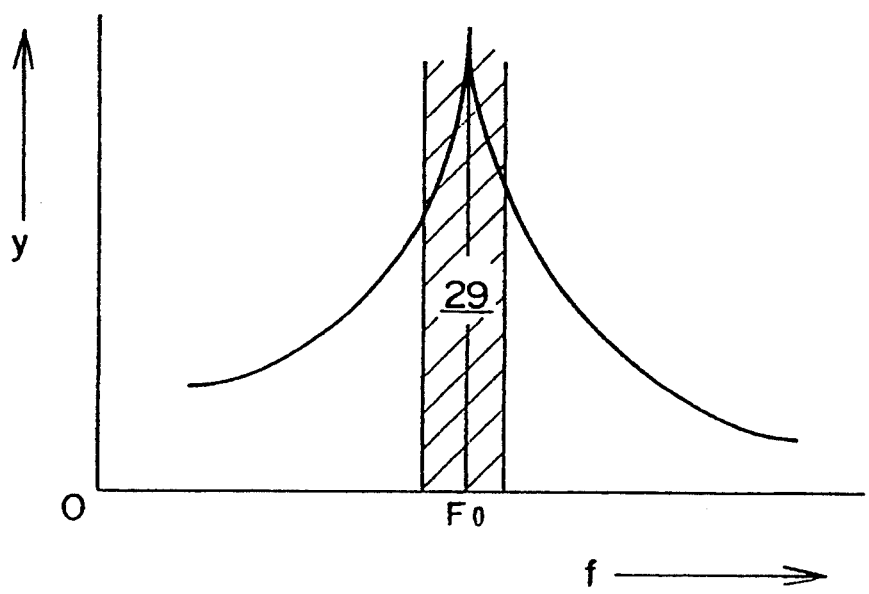
FIG. 12 is a diagram explaining the relation between the frequency of the supplied electric power and admittance under the resonance condition.
Figure 13:
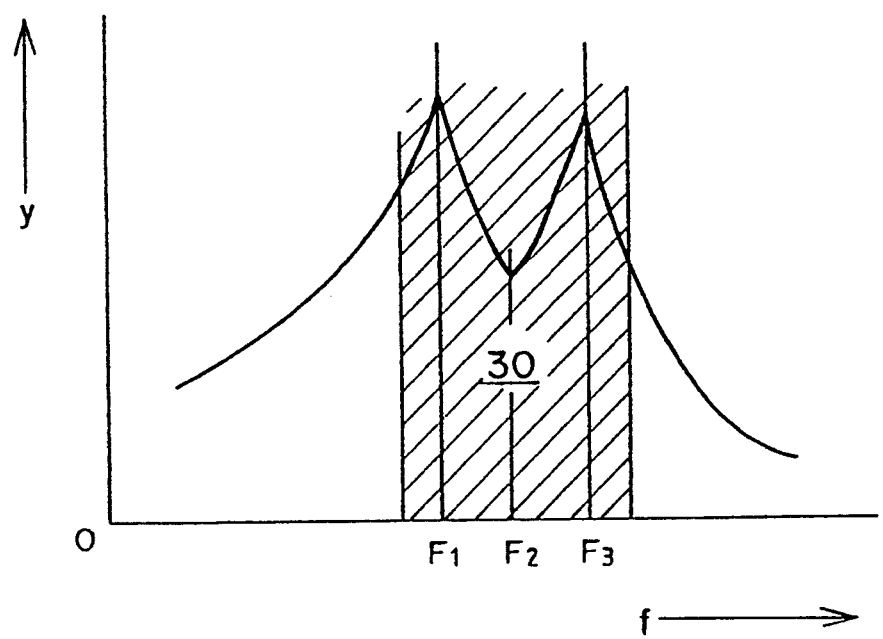
FIG. 13 is a diagram explaining the relation between the frequency of the supplied electric power and admittance when resonance state relatively disappeared.

The first determination step 53 is made as indicated in FIG. 11 in which the impedance curve of zn changing with the calculated value in the measurement step 52. On the curve of said impedance curve of zn, the calculated value in the measurement step 52 is compared with the standard value $zn-1$ to determine whether the present value is approximately maximum or not. The standard value $zn-1$ is then replaced with the presently obtained value zn and determine next-standard value. It is repeated through the compensation step 54, adjustment step 33, trial step 51, measurement step 52 and determination step 53 until the present value zn reaches approximately maximum.

In the case that the result obtained in the determination step 53 is repeated consecutively, the compensation step 54 will compensate the length ln of the tool protruded from the transducer by the predetermined length at the adjustment step 33 of this time and the compensated length $ln+1$ is used in the next adjustment step 33.

It is recommended to select plus or minus mark in accordance with the condition to impart to the length to be compensated.

Figure 3:
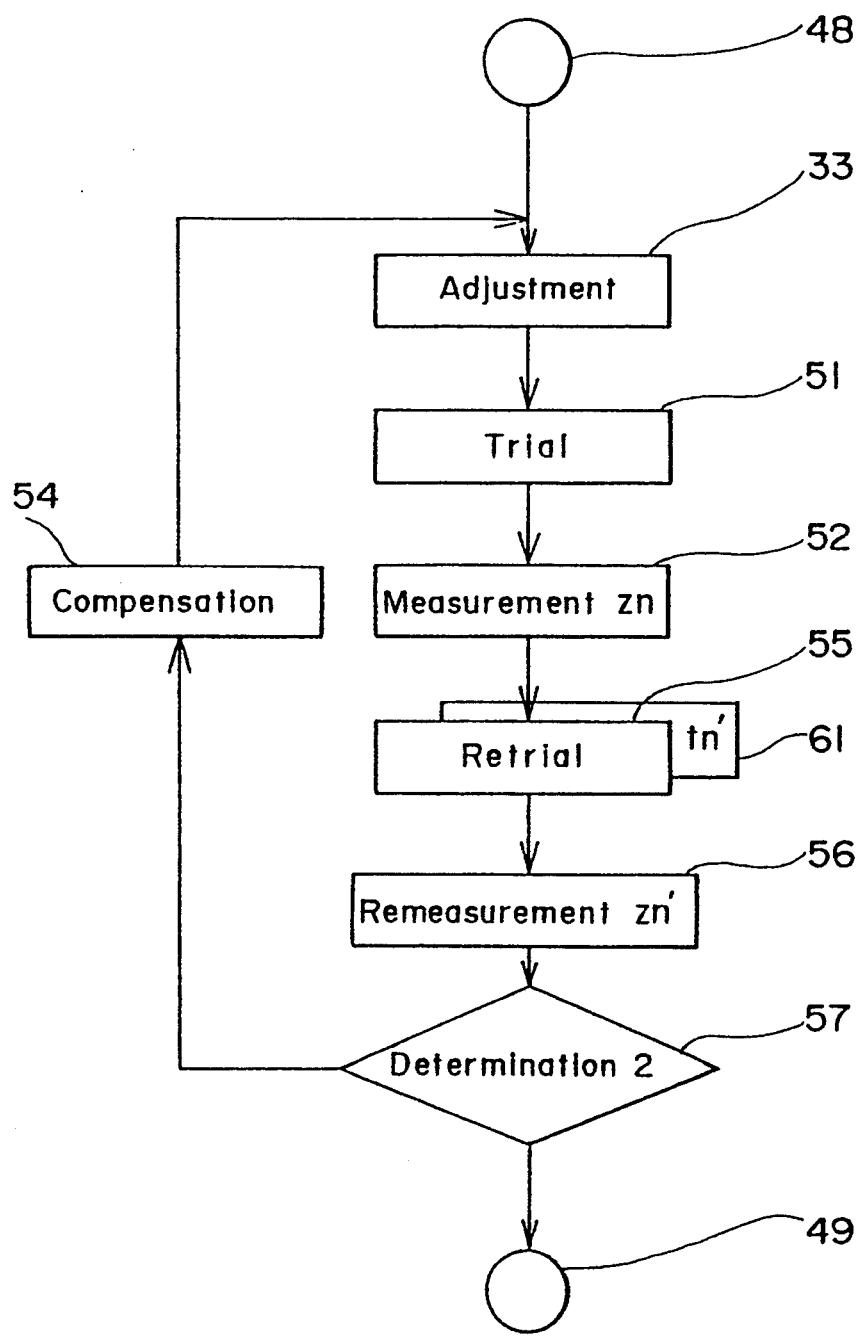
FIG. 3 is a partial flow sheet explaining the third and the fourth embodiments to perform the present invention.

FIG. 3 is a flow sheet to partially explain the third embodiment of the present invention.

The principal part of this third embodiment is to add the first retrial step 55 and the remeasurement step 56 following to the measurement step 52 as indicated in FIG. 2. The first determination step 53 is replaced with the second determination step 57. Except this replacement, the method of this embodiment is the same as the method of the second embodiment.

The first retrial step 55 is contacted to the surface of the trial electrode (not shown) provided to remeasure the bonding side of the tool. Further, as described in FIG. 5 the predetermined pressure (arrow) 14 is added in the axial direction of the tool to press said tool to the trial electrode (not shown) to supply the high frequency electric power to the transducer. This added pressure (arrow) 14 is removed at the second determination step 57 as described hereinafter.

Except for calculation of impedance value of zn' at the first retrial step 55, the remeasurement step 56 is the same as the remeasurement step 52 of the second embodiment.

The second determination step 57 compares the respectively obtained impedance values zn and zn' measured at measurement steps 52 and 56 to determine whether the value zn' measured at the remeasurement step 56 decreases or not. Until the zn' at the remeasurement step 56 decreases than the value zn at the measurement step 52 compensation, adjustment, trial, measurement, the first retrial, remeasurement and second determination, namely, steps 54, 33, 51, 52, 55, 56, 57 are consecutively repeated.

FIG. 3 is a partial flow sheet to explain the fourth embodiment of the present invention.

The principal part of the method of the fourth embodiment is to replace the first retrial step 55 with the second retrial step 61. Except for this replacement the method of the fourth embodiment does not differ from the method of the third embodiment.

The second retrial step 61 compensates the torque value tn to tighten the torque wrench in the tentative step 43 at the preparation step 41 in FIG. 1 by the predetermined amount by operating the torque wrench. Using said compensated torque value tn' the screw is tightened to fix the tool. Said compensated value tn' is to be returned to the torque value tn of original tightening power predetermined at the tentatively step 43 in the second determination step 57.

Figure 4:
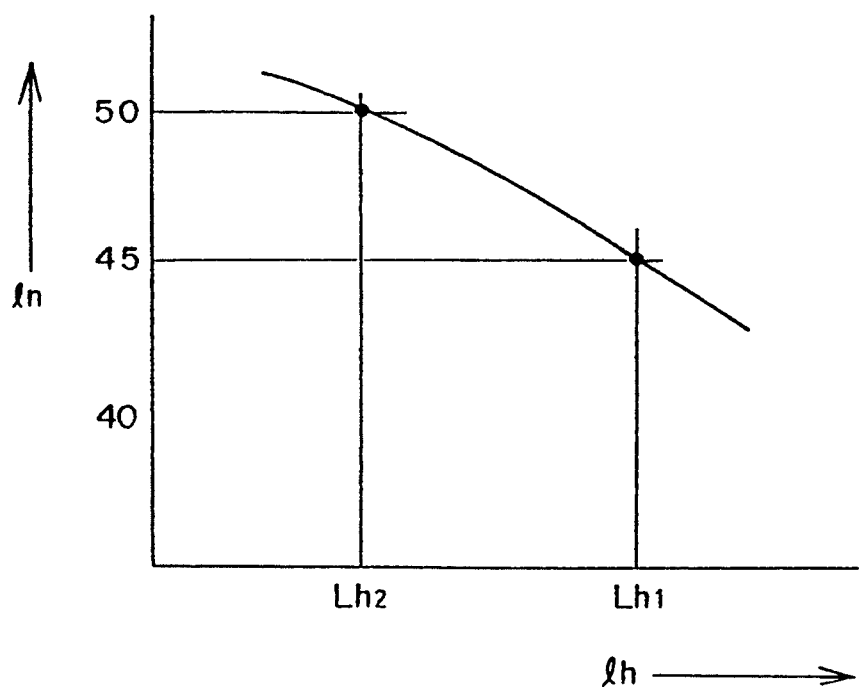
FIG. 4 is a diagram explaining the fifth embodiment to perform the present invention.

FIG. 4 is a drawing to explain the fifth embodiment of the present invention. In FIG. 4 vertical axis shows an upward change of the protruded length ln of the tool from the transducer in mm. unit and horizontal axis shows an increase of the length lh in the right ward direction from the connection part of cone and horn to clamp section. In accordance with deduction of this length lh the protruded length is expanded by ln.

The method of the fifth embodiment replaces the first avoidance step 42 with the second avoidance step 62. Except for this replacement the method of the fifth embodiment is the same as the method of the first embodiment.

Figure 5:
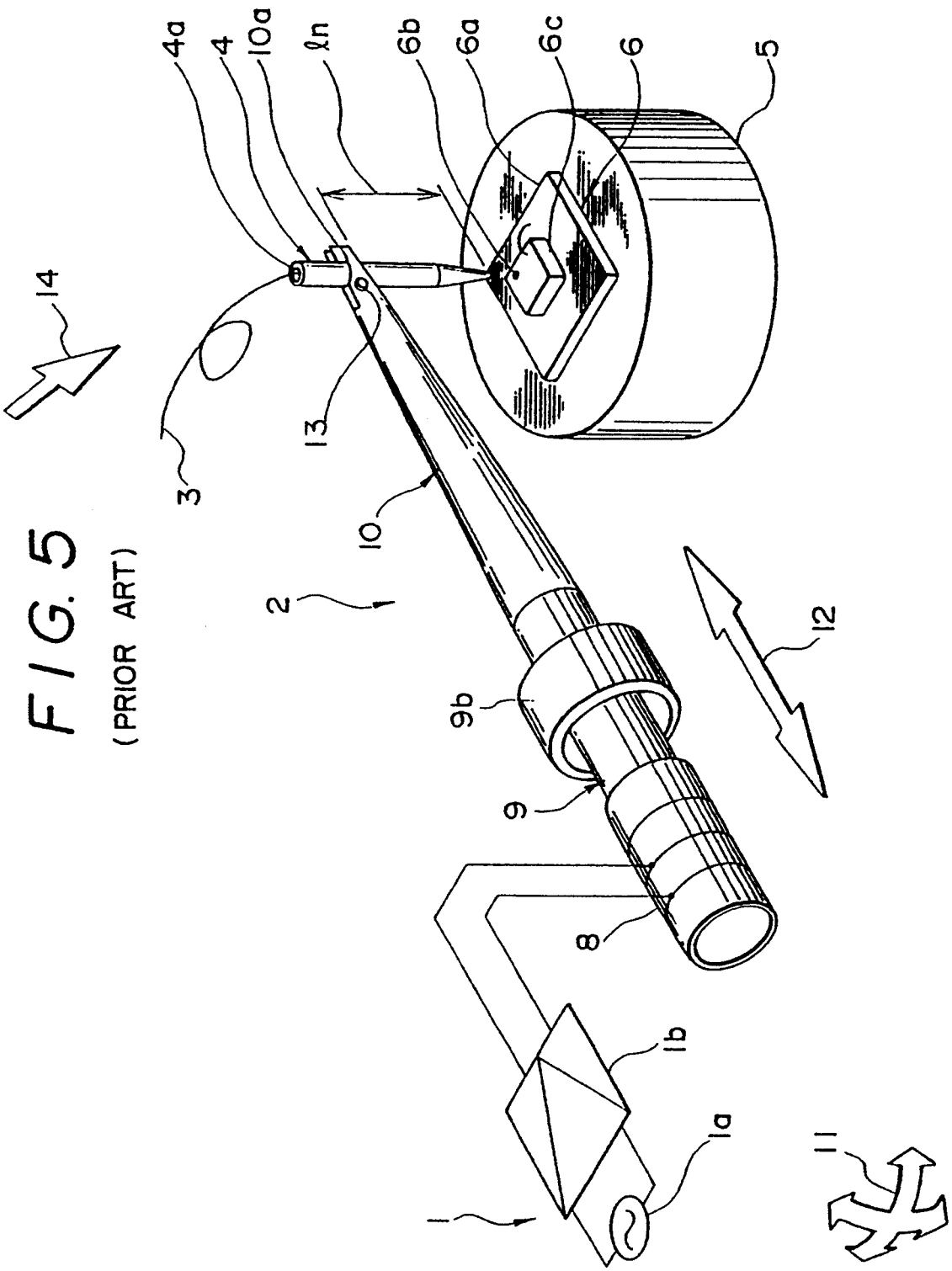
FIG. 5 is a drawing explaining an example of ultrasonic bonding using a general wire bonder system.
Figure 6:
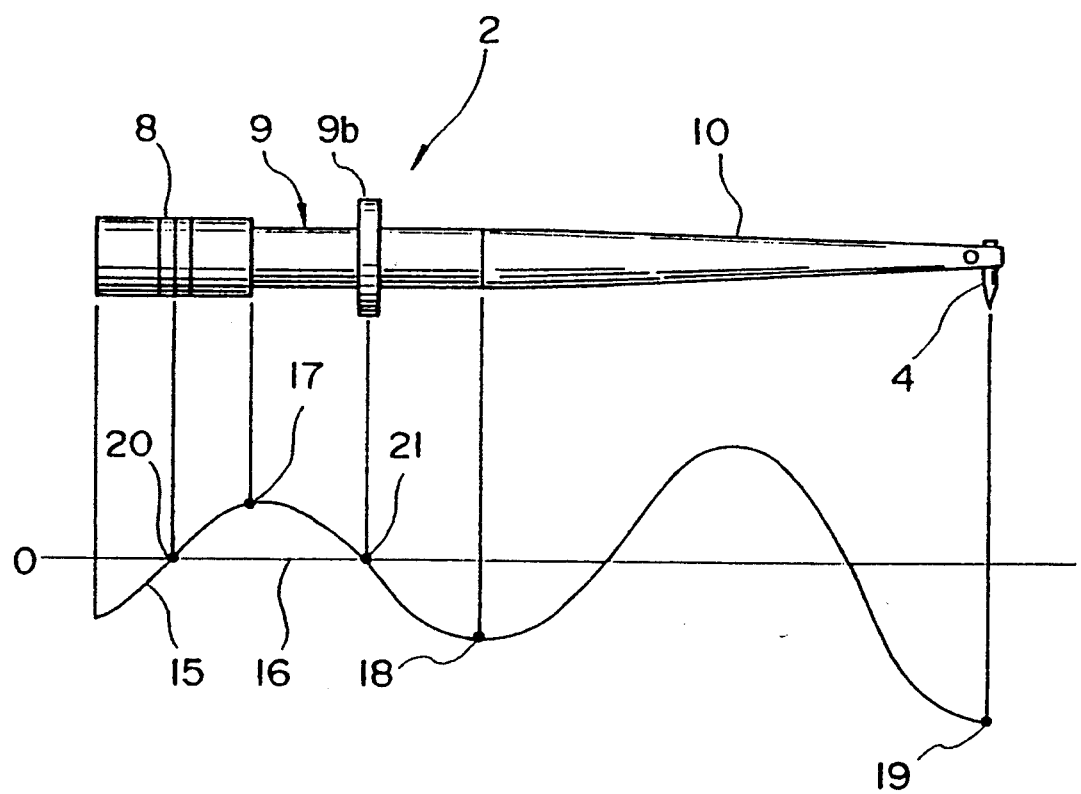
FIG. 6 is a diagram explaining transmission of mechanical vibration in FIG. 4.
Figure 8:
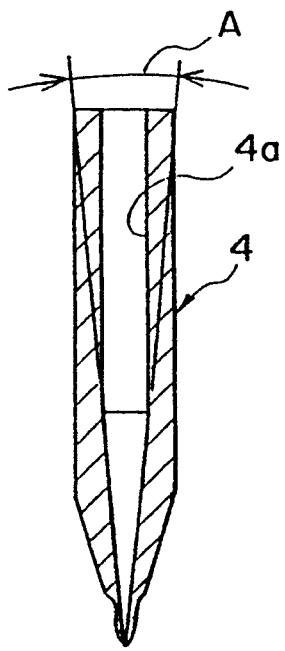
FIG. 8a and 8b are enlarged drawings to disclose cross-sections of capillary and wedge.
Figure 8:
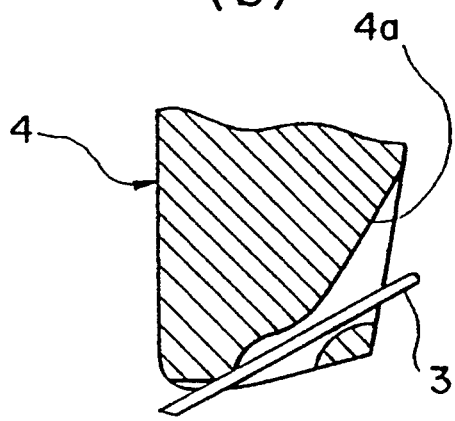
Figure 9:
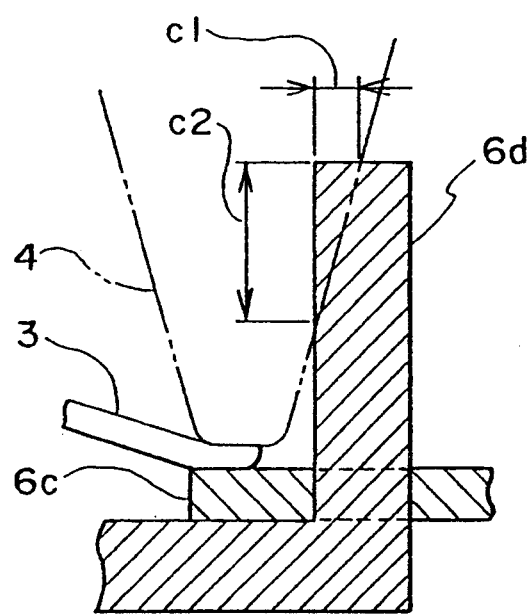
FIG. 9 is a drawing explaining the interference between the bonding side of the capillary and the package wall of the semiconductor parts.
Figure 10D:
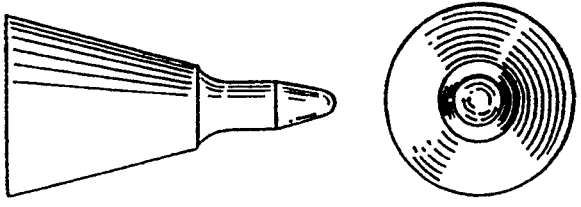
FIG. 10a–10d are partially enlarged drawings explaining the status at the bonding side of the capillary.
Figure 10C:
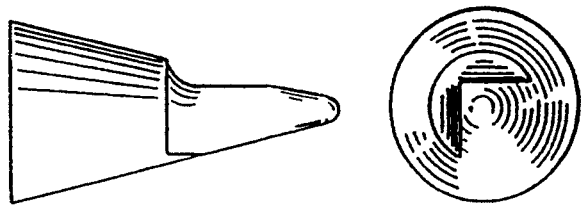
Figure 10B:
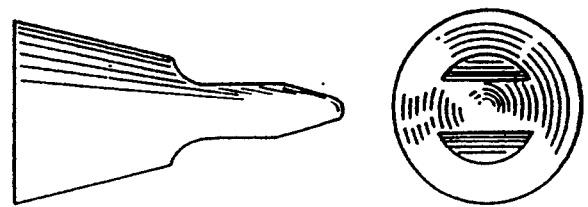
Figure 10A:
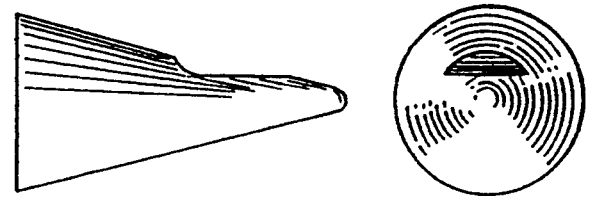

Referring to the length Lesc set in the determination step 46 in the preparation step 41, shown in FIG. 1 the second avoidance step 62, as shown in FIG. 5 in which the horn 10 of the transducer 2 and cone 9 to extract the effective component of mechanical vibration, adjust the predetermined length $Lh_1$ from the connection part to the clamp part 10a by the predetermined length and fix said length with the adjusted length $Lh_2$. The maximum value of impedance zn 24, 26 shown in FIG. 11 and another values 27, 28 belonging to the territory (slant portion) in the vicinity of these maximum values are avoided to maintain the protruded length ln to the optimum length for the wiring operation.

In this case these predetermined length $Lh_1$ and adjusted length $Lh_2$ are indicated on the transducer.

The present invention is not only limited to the scope of the foregoing preferred embodiment but also indicate the protruded length to be avoided with expression mark provided on the tool, or provide the indication circuit to indicate the maximization of the impedance value zn to supply the electric power to the amplifier of the electric power unit.

Various changes may be made without departing from the spirit and scope of the invention. For example, it is allowed to mount the tool in parallel with the transducer, to apply ordinary electric parts to the table and to apply another kinds of wiring materials not mentioned in the embodiments.

ADVANTAGES OF THE PRESENT INVENTION

The present invention has the following advantages and effects:

(1) Whether impedance value zn to supply high frequency electric power is decreased or not is searched changing the vibration transmitting property from the transducer to the tool by trially pressing the tool in its axial direction or tightening the fixing screw more strongly. It is, therefore, easy to determine and avoid the length of the tool to be protruded.

(2) It is possible to accurately avoid the length to be protruded because the impedance value zn to be supplied will measure the length to be protruded when the impedance value reaches approximately maximum.

(3) Further, even if the length measured in (2) is not suitable for bonding work, it is possible to adjust the length of the horn of the transducer by changing the transmission property of vibration physically to avoid the length in optimum working condition.

As described in the foregoing (1)–(3) it is possible to convert high frequency electric power to mechanical vibration by effectively transmitting the vibration in the transducer.

What is claimed is:

1. A wire bonder system comprising an electric power unit to supply high frequency electric power, a transducer to convert the electric power to mechanical vibration and to enlarge an effective component of the mechanical vibration, and a tool means for ultrasonic bonding of wire by utilizing the mechanical vibration of the transducer, said tool being mounted at a first end of said transducer, wherein a length with which the tool protrudes from said transducer is adjusted to determine a minimum value of impedance to thereby maximize on conversion of electrical power to mechanical vibration.

2. A wire bonder system according to claim 1 further comprising comparison means for determining a minimum impedance value at various tool lengths.

3. A wire bonder system according to claim 1 wherein a search means for determining said minimum value of impedance is provided which adds pressure to the tool in an axial direction.

4. A wire bonder system according to claim 1 wherein a length of said transducer is varied in order to determine said minimum value of impedance.

5. A wire bonder system according to claim 1 further comprising indicating means to indicate said minimum value of impedance.

6. A wire bonder system comprising:
an electric power means for supplying high frequency electric power;
a transducer means for converting said electric power to mechanical vibration, said transducer adapted to enlarge an effective component of the mechanical vibration;
tool means for ultrasonic bonding of wire by utilizing said mechanical vibration mounted at a first end of said transducer, said tool means being adapted to be adjusted in length; and
comparison means for determining extreme values of impedance at various tool lengths, wherein said comparison means compares subsequent values of impedance to determine said extreme values.

7. The wire bonder system of claim 6, wherein said length with which the tool protrudes from said transducer is adjusted to determine a minimum value of impedance to thereby maximize on conversion of electrical power to mechanical vibration.

8. The wire bonder system of claim 6, wherein said comparison means determines said impedance values from a pressure applied to said tool.

* * * * *